United States Patent
Yamaguchi

[11] Patent Number: 5,889,438
[45] Date of Patent: Mar. 30, 1999

[54] PHASE-LOCKED OSCILLATION AND CONTROL CIRCUIT WITH A WAVELET FILTER

[75] Inventor: Shigenori Yamaguchi, Tokyo, Japan

[73] Assignee: NEC Corporation, Tokyo, Japan

[21] Appl. No.: 915,692

[22] Filed: Aug. 21, 1997

[30] Foreign Application Priority Data

Aug. 21, 1996 [JP] Japan ................................ 8-219902

[51] Int. Cl.⁶ .............................. H03L 7/093; H03L 7/18
[52] U.S. Cl. ................................ 331/17; 331/46; 331/50; 331/175; 327/156; 327/159
[58] Field of Search ................ 331/17, 1 A, 14, 331/25, 46, 50, 175; 327/156, 159

[56] References Cited

FOREIGN PATENT DOCUMENTS

A1 7-283726  10/1995  Japan .

*Primary Examiner*—Arnold Kinkead
*Attorney, Agent, or Firm*—Foley & Lardner

[57] ABSTRACT

A phase-locked oscillation circuit, which minimizes phase fluctuation of an output clock signal generated by the phase-locked oscillation circuit, is provided. A wavelet filter performs a wavelet converting operation over phase fluctuations of an input reference signal and output clock signal of a phase-locked oscillator. It separates the phase fluctuation into a periodic fluctuation component and a non-periodic fluctuation component, optimizes a gain of the phase-locked oscillator on the basis of the periodic fluctuation component, and optimizes power supply filters of the phase-locked oscillator on the basis of the non-periodic fluctuation component.

7 Claims, 7 Drawing Sheets

PHASE-LOCKED OSCILLATION AND CONTROL CIRCUIT WITH A WAVELET FILTER

BACKGROUND OF THE INVENTION

1. Field of the Invention

The present invention relates to phase-locked oscillation circuits and, more particularly, to a phase-locked oscillation circuit for use in a high-speed communication system requiring low jitter characteristics.

2. Description of the Related Art

In a conventional phase-locked oscillation circuit, as described in Japanese Patent Laid-Open Application No. Hei 7-283726, it is so designed to have its loop gain small so as to eliminate phase noise in an output clock signal generated by the phase-locked oscillation circuit.

FIG. 7 is a schematic block diagram showing a configuration of a conventional phase-locked oscillation circuit. In the drawing, a phase-locked oscillation circuit (PLO) 20 comprises, a phase comparator 3, a Low Pass Filter (LPF) 4, an Amplifier (AMP) 5, a Voltage Control Oscillator (VCO or VCXO) 6, a frequency divider 7, resistors 21, 22 and 23, and a switch 8. A reference signal 10 in synchronism with a local oscillator or a network synchronization timing signal is frequency-multiplied by the PLO 20 to form a clock signal 30 of a communication line speed. The PLO 20 is designed for clock generation for the purpose of generating a communication line timing signal, and it requires, in addition to input and output signals, a power supply ground signal and an input signal for control of VCO or VCXO 6.

In the aforementioned conventional phase-locked oscillation circuit used for clock frequency multiplication, since the frequency of a phase comparison signal is lower than that of the output clock signal of the phase-locked oscillation circuit, the phase fluctuation is averaged by frequency-dividing the output clock signal by a frequency divider circuit, but no countermeasures are taken into account to suppress the phase fluctuation caused by noise passed from a power supply.

SUMMARY OF THE INVENTION

It is an object of the present invention to provide a phase-locked oscillation circuit which minimizes phase fluctuation of an output clock signal generated by the phase-locked oscillation circuit.

A phase-locked oscillation circuit in accordance with the present invention comprises:

- a gain-adjustable phase-locked oscillator for converting an input reference signal to an output clock signal to be used for a communication line timing signal;
- a power supply filter part including a plurality of power supply filters for eliminating noise caused by power supply;
- a switch part connected at its one side with a power supply of said phase-locked oscillator and connected at the other side with the power supply filters; and
- a wavelet filter which include a wavelet converter for subjecting time series data of phase fluctuation of input reference signal and output clock signal of the phase-locked oscillator to a wavelet converting operation, a PLO gain controller for controlling a loop gain of the phase-locked oscillator on the basis of a periodic phase fluctuation separated by the wavelet converter, and a power supply filter selector for controlling turning ON/OFF operation of the switch part on the basis of a non-periodic fluctuation separated through the wavelet converter.

The present invention measures the phase fluctuation of the input and output signals of the PLO at a given time (which measurement time being determined by the stability of the oscillator and the output frequency of the PLO), subjects its measurement result to a wavelet converting operation, and uses an optimum loop gain and power supply filters based on its result to thereby minimize the phase fluctuation of the PLO.

In accordance with an embodiment of the present invention, the phase-locked oscillation circuit further comprises a periodic fluctuation processor for finding an amplitude and period of the periodic phase fluctuation of the phase fluctuation obtained by the wavelet converter, and the PLO controller performs gain control of the phase-locked oscillator based on the amplitude and period.

In accordance with another embodiment of the present invention, the PLO controller judges, on the basis of the input and output signals of the phase-locked oscillator, whether a transfer function of the amplitude of the periodic phase fluctuation of the phase fluctuation obtained by the wavelet converter is less than 1 or not; and perform the gain control of the phase-locked oscillator when the transfer function is not less than 1 and when the input and output signals coincide with respect to period or satisfy a period relation of an integer multiple with each other.

In accordance with a further embodiment of the present invention, the phase-locked oscillation circuit further comprises a plurality of the phase-locked oscillators connected in cascade, and the PLO controller inputs an amplitude and period of the periodic phase fluctuation of the phase fluctuation of the input and output signals of the plurality of phase-locked oscillators, compares an amplitude ratio between the amplitudes of the input and output signals of each phase-locked oscillator, and sets the amplitude ratios of the phase fluctuations to be less than 1 sequentially from one of the phase-locked oscillators having the maximum amplitude ratio when the period of the input signal coincides with that of the output signal or is an integer multiple thereof.

In accordance with yet another embodiment of the present invention, the phase-locked oscillation circuit further comprises a non-periodical fluctuation processor for finding a variance of the non-periodical phase fluctuations of the phase fluctuations obtained by the wavelet converter, and the power supply filter selector controls the turning ON/OFF operation of the switch part to select one of the power supply filters having the minimum variance.

In accordance with yet a further embodiment of the present invention, the phase-locked oscillation circuit further comprises a non-periodical fluctuation processor for finding a variance of the non-periodical phase fluctuations of the phase fluctuations obtained by the wavelet converter, and the power supply filter selector controls turning ON/OFF operation of the switch part to select one of the mounted power supply filters having the minimum variance with respect to all combinations of the power supply filters.

In accordance with other embodiment of the present invention, the phase-locked oscillation circuit comprises a plurality of stages of phase-locked oscillators connected in cascade, and the power supply filter selector selects one of the power supply filters having the minimum variance of the non-periodical phase fluctuations of an output signal of the last-stage of said plurality of stages of the phase-locked oscillators.

DETAILED DESCRIPTION OF THE PREFERRED EMBODIMENTS

An embodiment of the present invention will be explained with reference to the drawings.

Figure 1:
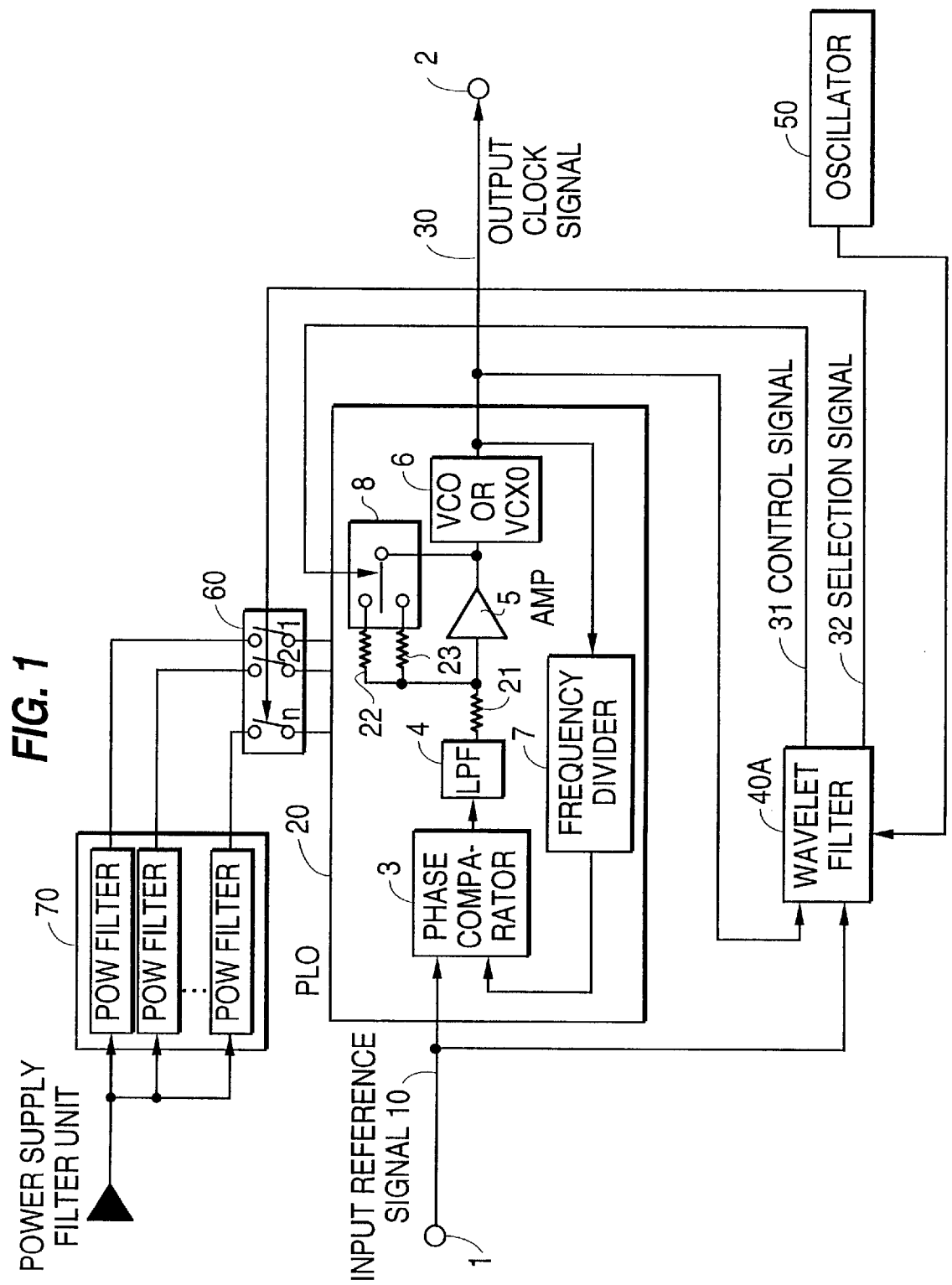
FIG. 1 is a schematic block diagram showing a configuration of a phase-locked oscillation circuit in accordance with an embodiment of the present invention.
Figure 7:
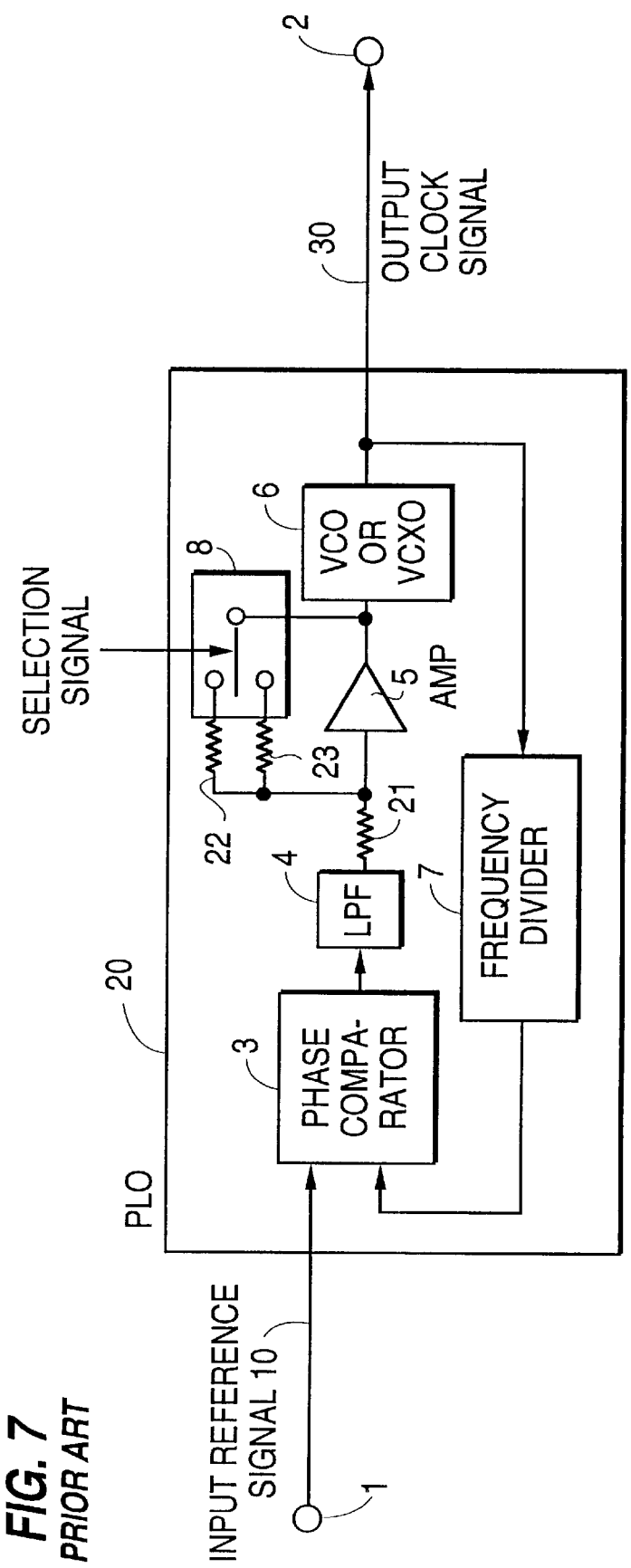
FIG. 7 is a schematic block diagram showing a configuration of a conventional phase-locked oscillation circuit.

FIG. 1 is a schematic block diagram showing a configuration of a phase-locked oscillation circuit in accordance with an embodiment of the present invention. In FIG. 1, the same parts as those in FIG. 7 are denoted by the same reference numerals or symbols.

The phase-locked oscillation circuit of the present embodiment comprises a gain-adjustable phase-locked oscillator (PLO) 20, a wavelet filter 40A for subjecting time-series data of phase fluctuations of an input reference signal 10 and an output clock signal 30 to a wavelet conversion and for performing a switching operation with a switch 8 under control of a control signal 31 to adjust a gain of the phase-locked oscillator 20, an oscillator 50 for supplying a stable clock signal to the wavelet filter 40A, a switch unit 60 turned ON/OFF by a selection signal 32 received from the wavelet filter 40A, and a power supply filter unit 70 made of a plurality of power supply filters which are selected when the switch unit 60 is turned ON.

Figure 2:
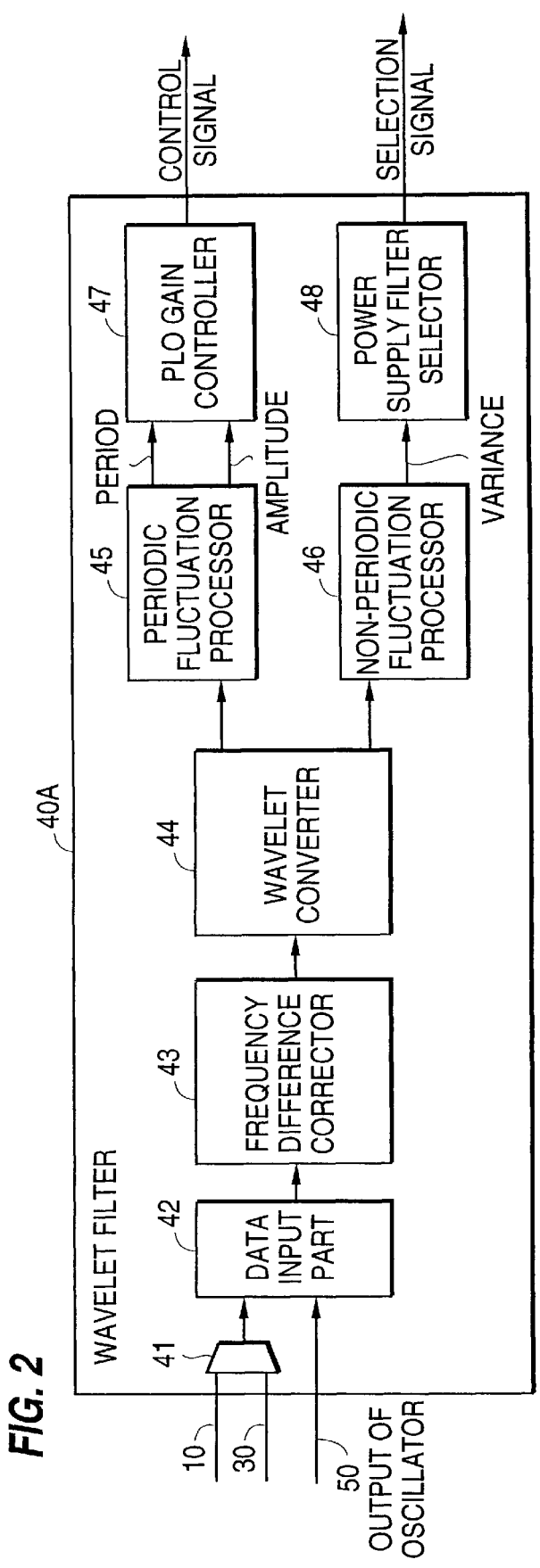
FIG. 2 is a schematic block diagram showing a configuration of a wavelet filter 40A shown in FIG. 1.

FIG. 2 shows a structure of the wavelet filter 40A. The wavelet filter 40A is made up of a selector 41, a data input part 42, a frequency difference corrector 43, a wavelet converter 44, a periodic fluctuation processor 45, a non-periodic fluctuation processor 46, a PLO gain controller 47, and a power supply filter selector 48.

The data input part 42, on the basis of the clock signal received from the oscillator 50, takes phase fluctuations in the input reference signal 10 and output clock signal 30 of the phase-locked oscillator 20 in the time series with a time period defined by the wavelet filter 40A.

The frequency difference corrector 43 corrects a frequency difference between the output clock signal 30 of the phase-locked oscillator 20 and the output clock signal of the oscillator 50. One of the methods for correcting the frequency difference is, for example, use of the least squares method.

Through this correcting process, a phase drift component based on the frequency difference is removed to obtain phase fluctuation data, the phase fluctuation data is applied to the wavelet converter 44 to be subjected thereby to a wavelet conversion.

As a result, the phase fluctuation extracted by the frequency difference corrector 43 is separated into a periodic fluctuation component and a non-periodic fluctuation component. An example of the separation is shown in FIG. 3.

Figure 3:
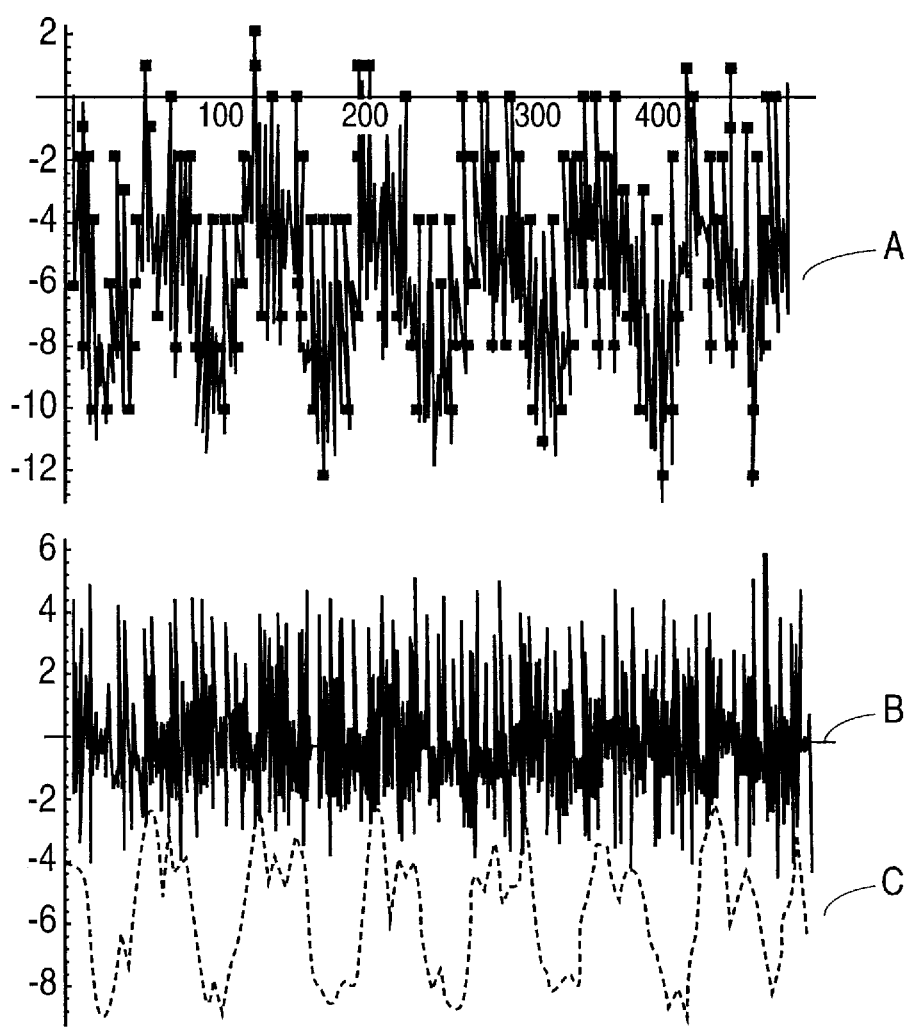
FIG. 3 is a sample data showing the phase fluctuation (A), non-periodic fluctuation component (B) and periodic component (C) of an output clock signal generated from a phase-locked oscillation circuit.

Symbol A in FIG. 3 denotes the phase fluctuation data of the phase-locked oscillator 20, symbol B in FIG. 3 denotes the non-periodic fluctuation component of the phase fluctuation separated through the wavelet conversion, and symbol C in FIG. 3 denotes the periodic fluctuation component.

The separated periodic phase fluctuation component is applied to the periodic fluctuation processor 45. Further, the separated non-periodic fluctuation component is applied to the non-periodic fluctuation processor 46.

The periodic fluctuation processor 45 calculates and finds a period and amplitude of the periodic phase fluctuation found by the wavelet converter 44, and sends them to the PLO gain controller 47.

The PLO gain controller 47 decreases the gain of the PLO 20 (selects one of gains selectable by the PLO 20 and next smaller than the current value) when an amplitude ratio (the peak-peak value of amplitude of the periodic phase fluctuation of the output clock signal 30 divided by the peak-peak value of amplitude of the periodic phase fluctuation of the input reference signal 10) is 1 or more and when a ratio (the number of cross points of an average of the periodic phase fluctuation of the output clock signal 30 (or input reference clock 10) divided by the number of cross points of an average of the periodic phase fluctuation of the input reference clock 10 (or output clock signal 30)) between the received period and the phase comparison period of the PLO 20 is an integer multiple; and does nothing when the period ratio is not an integer multiple. When the period ratio is an integer, it can be judged that the cause of the periodic fluctuation results from the gain of the PLO 20.

The non-periodic fluctuation processor 46 finds a variance of the non-periodic fluctuations found by the wavelet converter 44 and sends it to the power supply filter selector 48.

The power supply filter selector 48 stores the received variance value and the current selection signal, passes the variance through all the power supply filters, and outputs the selection signal 32 which selects one of the power supply filters providing the minimum variance value.

In FIG. 1, the switch unit 60, on the basis of the selection signal 32 received from the power supply filter selector 48, is turned ON/OFF. This can be simply arranged with use of an analog switch. Further, the power supply filter unit 70 is made up of a plurality of conventional power supply filters having different cut-off frequencies.

Figure 4:
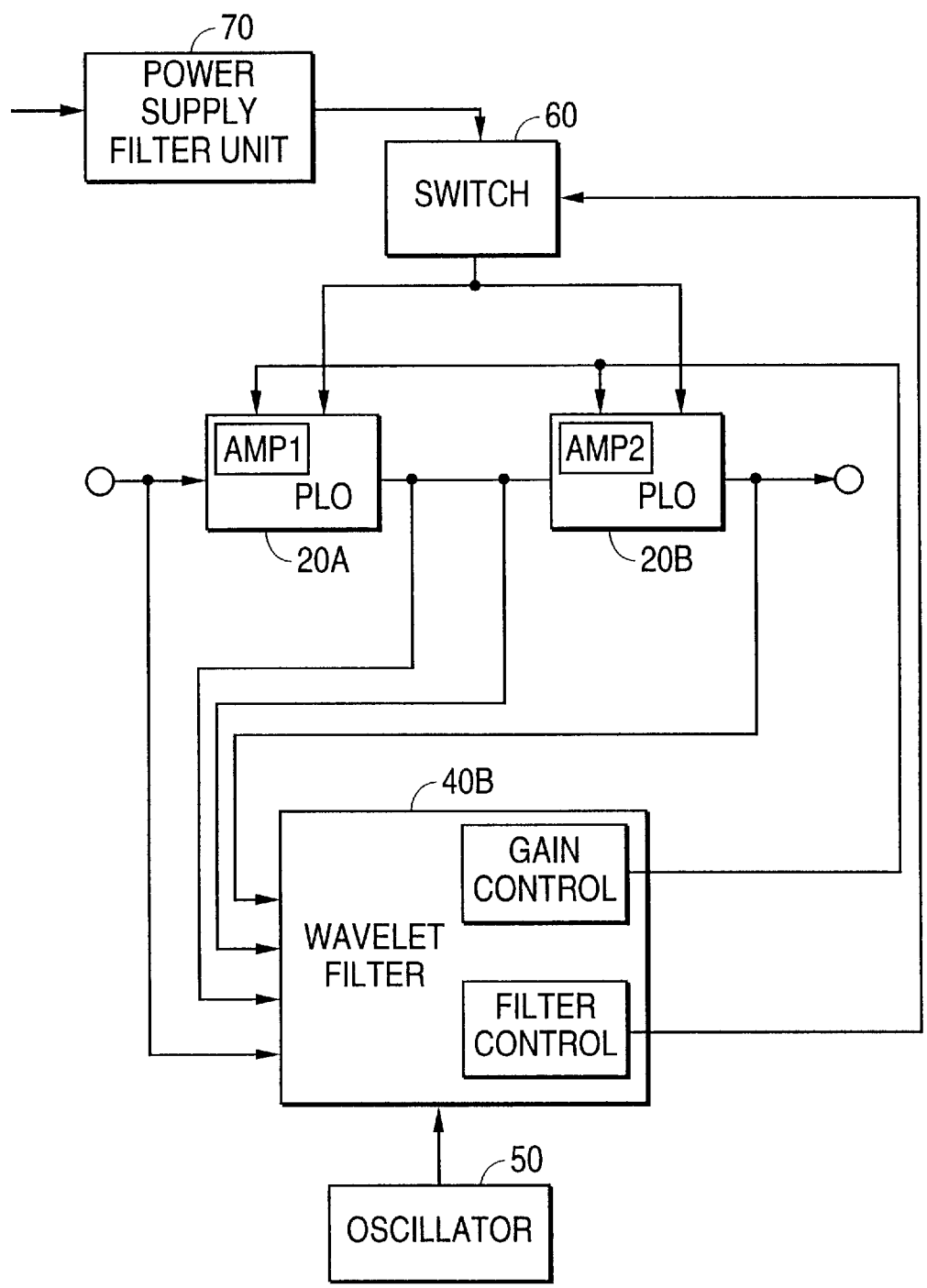
FIG. 4 is a schematic block diagram showing a configuration of a phase-locked oscillation circuit in accordance with another embodiment of the present invention.

FIG. 4 shows a configuration of a phase-locked oscillation circuit in accordance with a second embodiment of the present invention.

The present embodiment is arranged so that 2 PLOs, 20A and 20B, are connected in cascade and a wavelet filter 40B detects phase fluctuation in the input reference signal 10 and output clock signal 30 of the respective PLOs 20A and 20B. The wavelet filter 40B has a similar structure to that explained in FIG. 2; and the oscillator 50, power supply filter unit 70 and switch unit 60 are the same as those explained in FIG. 1.

The wavelet filter 40B, when the amplitude ratio in the periodic phase fluctuation between the input reference signal and output clock signal of the PLO 20A is one or more, decreases the loop gain of the PLO 20A and similar gain control is carried out even over the PLO 20B, thereby realizing the total gain optimization of the clock path.

The power supply filters are selected so as to minimize the non-periodic fluctuation detected by the wavelet filter 40B. That is, for combinations of all the power supply filters, the variance value of the output phase fluctuation of the PLO 20B is found and the power supply filters are selected to provide the minimum variance.

Even when the number of phase-locked oscillators connected in cascade is increased, a similar explanation can be applied by changing the number of cascaded-stages from 2 in the above explanation.

As has been explained above, in FIG. 1, the wavelet filter 40A compares the phase fluctuation of the reference signal 10 with the output clock of the oscillator 50 to measure a phase difference between a rising edge (or falling edge) of the clock of the oscillator 50 and a rising edge (or falling edge) of the clock of the reference signal 10, and the phase difference is input to the data input part 42 to be converted to a digital signal, for which reason the subsequent processing can be realized by a digital signal processing circuit.

Figure 5:
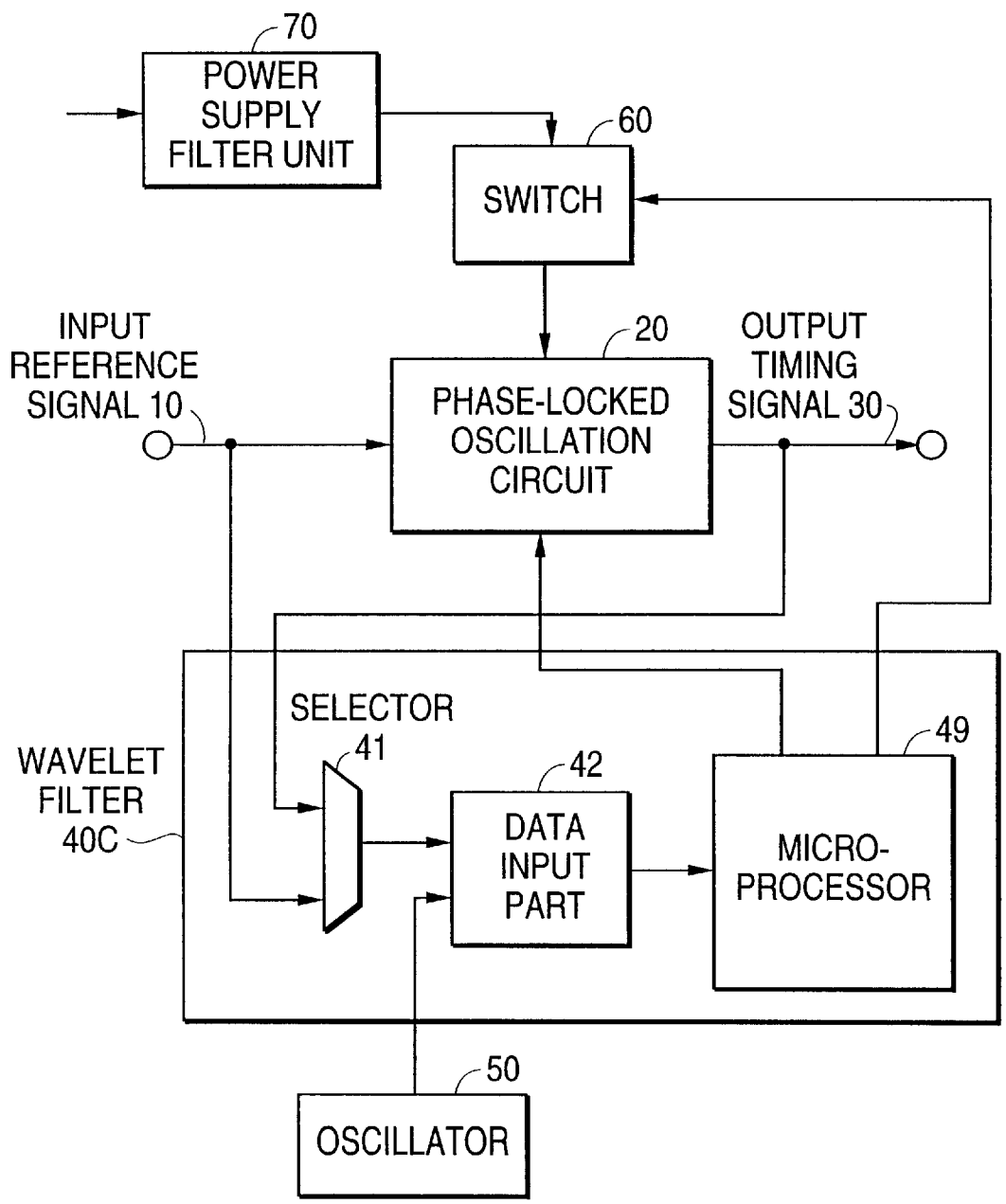
FIG. 5 is a schematic block diagram showing a configuration of a phase-locked oscillation circuit in accordance with yet another embodiment of the present invention.

An example of such realization is shown in FIG. 5.

Although the digital signal processing circuit is realized in the form of a microprocessor 49 shown in the drawing, it may be realized also in the form of a digital signal processor or dedicated integrated circuit.

The input reference signal 10 and the output clock signal 30 are input to the selector 41. Either one is selected by the microprocessor 49. The selected signal is input to the data input part 42 to detect a phase difference in its rising phase or falling phase with the clock signal received from the oscillator 50.

The detecting method is, for example, in a digital counting method, to count the phase difference with use of a high-rate clock, or, in an analog counting method, to convert the phase difference to a digital signal with use of an analog-digital converter.

The phase difference digital signal detected by the data input part 42 is input as time series data to the microprocessor 49 at a given time. In most cases, since the signal received from the selector 41 does not coincide with the clock signal received from the oscillator 50 with respect to frequency, it is necessary to correct the frequency difference.

The correction is carried out usually by the least squares method.

The time when the phase difference is input as the time series data can be arbitrarily set. The input time series data is processed in accordance with a flow chart of FIG. 6 to control the phase-locked oscillator 20 and switch unit 60 and to minimize the phase fluctuation.

Figure 6:
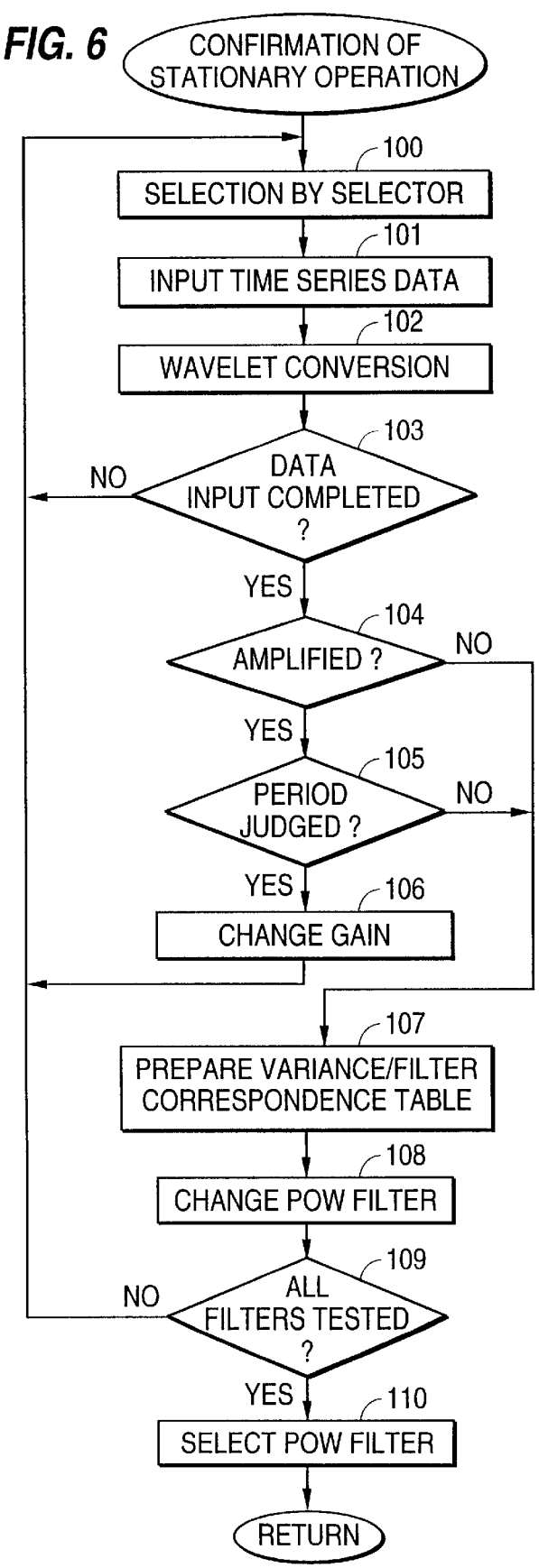
FIG. 6 is a flowchart showing the operation of a microprocessor 49 in the embodiment of FIG. 5.

FIG. 6 will be explained in detail in the following.

In FIG. 5, a wavelet filter 40C operates only when the phase-locked oscillator 20 stationarily operates.

First, the selector 41 selects the input reference signal 10 of the phase-locked oscillator 20(step 100), inputs the data by a set number of data (step 101), and then subjects it to a wavelet converting operation to separate the phase fluctuation into periodic data and non-periodic data (step 102). The selector finds an amplitude peak-peak value and period of the periodic phase fluctuation from the separated periodic data and finds a variance of the fluctuation from the separated non-periodic fluctuation. These 3 data are stored in a memory of the selector 41 as data of the input reference signal 10 being now selected.

Next, control is returned to the selector selecting operation (step 100) so that the input signal of the data input part 42 is changed to the output clock signal 30.

After inputting the data (step 101), the selector stores a peak-peak value, period and variance in the memory as the data of the output timing signal 30 in accordance with the aforementioned operation.

One stage of phase-locked oscillator is provided in the present embodiment, but a plurality of stages of phase-locked oscillators may also be applied. When the number of stages is N for example, the aforementioned operation is carried out by the N phase-locked oscillators.

At the time when all the data is fully input, a judgement condition (step 103) is YES and control goes to a step 104 for execution. In the step 104, the wavelet filter performs its gain adjusting operation when a ratio (the peak-peak value of amplitude of the periodic phase fluctuation of the output clock signal 30 divided by the peak-peak value of amplitude of the periodic phase fluctuation of the input reference signal 10) between the fluctuation amplitude of the input reference signal 10 and the fluctuation amplitude of the output clock signal 30 is 1 or more; whereas, the wavelet filter performs its power supply filter changing operation when the ratio is less than 1. When the amplitude ratio is 1 or more in the step 104, the wavelet filter compares the period of the phase fluctuation of the input reference signal 10 with the period of the phase fluctuation of the output clock signal 30 (step 105).

When, in the comparison, the period of the phase fluctuation of the input reference signal 10 is an integer multiple of the period of the phase fluctuation of the output clock signal 30 or satisfies its reverse relation, the wavelet filter outputs an instruction indicative of change of the loop gain as a selection signal (step 106).

When judgement is NO in the step 104 or 105, the wavelet filter starts its power supply filter changing operation. In step 107, the gain adjustment is carried out and the variance of the phase fluctuation of the non-periodic phase of the current filter configuration is stored in the memory.

Thereafter, the wavelet filter finds a variance of the non-periodic phase fluctuation with respect to each of all the filter combinations and prepares a correlation list between the filter configurations and variances.

In step 110, one of the power supply filters providing the minimum variance is selected from the list.

As has been explained in the foregoing, in accordance with the present invention, the phase fluctuation generated from the PLO is dissolved into the periodic fluctuation component and the non-periodic fluctuation component to realize the optimization of the loop gain of the PLO and the optimization of the power supply filters on the basis of the values, whereby there can be provided a phase-locked oscillator which has a good phase noise characteristic.

Although the present invention has been fully described by way of the preferred embodiments thereof with reference to the accompanying drawings, various changes and modifications will be apparent to those having skill in this field. Therefore, unless these changes and modifications otherwise depart from the scope of the present invention, they should be construed as included therein.

What is claimed is:

1. A phase-locked oscillation circuit comprising:
   a gain-adjustable phase-locked oscillator for converting an input reference signal to an output clock signal to be used for a communication line timing signal;
   a power supply filter part including a plurality of power supply filters for eliminating noise caused by power supply;
   a switch part connected at its one side with a power supply of said phase-locked oscillator and connected at the other side with said power supply filters; and
   a wavelet filter including;

a wavelet converter for subjecting time series data of phase fluctuation of input reference signal and output clock signal of the phase-locked oscillator to a wavelet converting operation;

a PLO gain controller for controlling a loop gain of said phase-locked oscillator on the basis of a periodic phase fluctuation separated by the wavelet converter; and a power supply filter selector for controlling turning ON/OFF operation of said switch part on the basis of a non-periodic fluctuation separated through said wavelet converter.

2. A phase-locked oscillation circuit as set forth in claim 1, further comprising a periodic fluctuation processor for finding an amplitude and period of the periodic phase fluctuation of the phase fluctuation obtained by the wavelet converter, and wherein said PLO gain controller performs gain control of said phase-locked oscillator based on the amplitude and period.

3. A phase-locked oscillation circuit as set forth in claim 2, wherein said PLO gain controller judges, on the basis of an amplitude ratio of the periodic phase fluctuation amplitude of the output clock signal to the periodic phase fluctuation amplitude of the input reference signal obtained by said periodic fluctuation processor, whether said amplitude ratio is 1 or more; and performs said loop gain control of said phase-locked oscillator when said amplitude ratio is 1 or more and when a period ratio between the output clock signal and the input reference signal coincide with each other or satisfy a relation of an integer multiple with each other.

4. A phase-locked oscillation circuit as set forth in claim 1, further comprising a plurality of said phase-locked oscillators connected in cascade, and wherein said PLO gain controller inputs an amplitude and period of the periodic phase fluctuation of the phase fluctuation of the input and output signals of the plurality of phase-locked oscillators, compares an amplitude ratio between the amplitudes of the input and output signals of each phase-locked oscillator, and sets the amplitude ratios of the phase fluctuations to be less than 1 sequentially from one of the phase-locked oscillators having the maximum amplitude ratio when the period of the input signal coincides with that of the output signal or is an integer multiple thereof.

5. A phase-locked oscillation circuit as set forth in claim 1, further comprising a non-periodical fluctuation processor for finding a variance of the non-periodical phase fluctuations of the phase fluctuations obtained by the wavelet converter, and wherein said power supply filter selector controls the turning ON/OFF operation of said switch part to select one of the power supply filters having the minimum variance.

6. A phase-locked oscillation circuit as set forth in claim 4, further comprising a non-periodical fluctuation processor for finding a variance of the non-periodical phase fluctuations of the phase fluctuations obtained by the wavelet converter, and wherein said power supply filter selector controls turning ON/OFF operation of said switch part to select one of mounted power supply filters having the minimum variance with respect to all combinations of the power supply filters.

7. A phase-locked oscillation circuit as set forth in claim 1, comprising a plurality of stages of phase-locked oscillators connected in cascade, and wherein said power supply filter selector selects one of the power supply filters having the minimum variance of the non-periodical phase fluctuations of an output signal of a last-stage of said plurality of stages of the phase-locked oscillators.

* * * * *